(12) United States Patent
Russo et al.

(10) Patent No.: US 11,875,908 B2
(45) Date of Patent: Jan. 16, 2024

(54) ELECTRODE WITH RADIOISOTOPE AND PHOSPHOR COMPOSITE LAYER FOR HYBRID RADIOISOTOPE BATTERIES AND RADIOLUMINESCENT SURFACES

(71) Applicant: U.S. DEVCOM Army Research Laboratory, Adelphi, MD (US)

(72) Inventors: John A Russo, Spencerville, MD (US); Marc S. Litz, Columbia, MD (US); William B. Ray, II, Lubbock, TX (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 238 days.

(21) Appl. No.: 17/363,886

(22) Filed: Jun. 30, 2021

(65) Prior Publication Data

US 2021/0327604 A1   Oct. 21, 2021

Related U.S. Application Data

(62) Division of application No. 16/366,792, filed on Mar. 27, 2019, now Pat. No. 11,081,252.

(51) Int. Cl.
*G21H 3/02* (2006.01)
*H01L 31/0304* (2006.01)
(Continued)

(52) U.S. Cl.
CPC ............... *G21H 3/02* (2013.01); *C25D 13/02* (2013.01); *C25D 13/22* (2013.01);
(Continued)

(58) Field of Classification Search
CPC .......... H01L 31/055; H01L 31/022475; H01L 31/03046; H01L 31/03048; H01L 31/075; G21H 3/02
(Continued)

(56) References Cited

U.S. PATENT DOCUMENTS 3,714,011 A   1/1973   Grosso et al.
5,721,462 A   2/1998   Shanks
(Continued)

FOREIGN PATENT DOCUMENTS

GB           818108      12/1959
KR       2011034300 A  *  4/2011
(Continued)

OTHER PUBLICATIONS

KR-2011034300-A English machine translation (Year: 2011).*
(Continued)

*Primary Examiner* — Andrew J Golden
(74) *Attorney, Agent, or Firm* — Eric B. Compton

(57) ABSTRACT

An electrode for beta-photovoltaic cells includes: a substrate formed of a conductive layer with a thickness ranging between about 10 nm to 1 micron; a composite layer of radioluminescent phosphor with radioisotope particles homogeneously dispersed therein formed on conductive substrate with a thickness ranging between about 1 and 25 microns; and a semiconductor comprising a P-i-N/P-u-N junction or a N-i-P-P junction. The radioisotope may be a beta-emitter, such as Ni-63, H-3, Pm-147, or Sr-90/Y-90.

19 Claims, 11 Drawing Sheets

(51) Int. Cl.
| | |
|---|---|
| H01L 31/0224 | (2006.01) |
| H01L 31/055 | (2014.01) |
| H01L 31/075 | (2012.01) |
| C25D 13/02 | (2006.01) |
| C25D 13/22 | (2006.01) |
| H01L 31/18 | (2006.01) |

(52) U.S. Cl.
CPC ........... *H01L 31/022475* (2013.01); *H01L 31/03046* (2013.01); *H01L 31/03048* (2013.01); *H01L 31/055* (2013.01); *H01L 31/075* (2013.01); *H01L 31/1884* (2013.01)

(58) Field of Classification Search
USPC .......................................... 136/253; 310/303
See application file for complete search history.

(56) References Cited

U.S. PATENT DOCUMENTS

| | | | |
|---|---|---|---|
| 7,663,288 | B2 | 2/2010 | Chandrashekhar et al. |
| 10,144,707 | B2 | 12/2018 | Russo et al. |
| 11,081,252 | B2 | 8/2021 | Russo et al. |
| 2005/0183765 | A1* | 8/2005 | Ho ................. H01L 31/0508 136/251 |
| 2005/0231064 | A1* | 10/2005 | Raffaelle .............. G21H 1/04 310/305 |
| 2009/0056809 | A1* | 3/2009 | Chen .............. H01L 31/035272 136/262 |
| 2010/0186816 | A1 | 7/2010 | Park |
| 2014/0264256 | A1 | 3/2014 | Nikolic et al. |
| 2015/0075593 | A1 | 3/2015 | Choi et al. |
| 2015/0310952 | A1* | 10/2015 | Cabauy ................ G21H 1/06 310/303 |
| 2018/0372891 | A1 | 12/2018 | Cao |

FOREIGN PATENT DOCUMENTS

| | | | |
|---|---|---|---|
| KR | 20150033819 | 4/2015 | |
| WO | WO-2004068548 A2 * | 8/2004 | ............... G21H 1/06 |
| WO | 2014191718 | 12/2014 | |

OTHER PUBLICATIONS

Xu et al., Structural effects of ZnS:Cu phosphor layers on beta radioluminescence nuclear battery, J Radioanal Nucl Chem (2015) 303:2313-2320. (Year: 2015).*

L. Besra and M. Liu, "A review on fundamentals and applications of electrophoretic deposition," Progress in Materials Science, vol. 52, pp. 1-61, 2007.

M. Sychov, A. Kavetsky, G. Yakubova, G. Walter, S. Yousaf, Q. Lin, D. Chan, H. Socarras and K. Bower, "Alpha indirect conversion radioisotope power source," Journal of Applied Radiation and Isotopes, vol. 66, No. 2, pp. 173-177, 2008.

H. Liang, X.-B. Tang, Z.-H. Xu, Y.-P. Liu and D. Chen, "Parameter Optimization and Experiment Verification for a Beta Radioluminescence Nuclear Battery," Journal of Radioanalytical and Nuclear Chemistry, pp. 701-707, 2014.

F. Li, X. Gao, Y. Yuan, J. Yuan and M. Lu, "GaN PIN betavoltaic nuclear batteries," Science China Technological Sciences: Nuclear Science and Technology, vol. 57, No. 1, pp. 25-28, 2014.

Marc Litz, "Isotope Beta-Battery Approaches for Long-Lived Sensors: Technology Review," ARL-TR-7048, U.S. Army Research Laboratory, Aug. 2014.

J. Russo, M. S. Litz and D. Katsis, "Commercial-off-the-shelf (COTS) indirect energy conversion (IDEC) isotope design structure and power management," Report No. ARL-TR-7158, Adephi, MD, Dec. 2014.

C. Munson, M. Arif, J. Streque, S. Belahsene, A. Martinez, A. Ramdane, Y. El Gmili, J. Salvestrini and A. Ougazzaden, "Model of Ni-63 battery with realistic PIN structure," Journal of Applied Physics, vol. 118, No. 10, 2015.

V. Bormashov, "Development of nuclear microbattery prototype based on Schottky barrier diamond diodes," Physica Status Solidi A, vol. 212, No. 11, pp. 2539-2547, 2015.

J. B. Talbot and J. Mckittrick, "Review - Electrophoretic Deposition of Phosphors for Solid-State Lighting," ECS Journal of Solid State Science and Technology, vol. 5, No. 1, pp. 3107-3120, 2015.

C. Thomas, S. Portnoff and M. G. Spencer, "High Efficiency 4H-SiC Betavoltaic Power Sources Using Tritium Radioisotopes," Applied Physics Letters , 2016.

Y. R. Uhm, B. G. Choi, J. B. Kim, D. H. Jeong and K. J. Son, "Study of a betavoltaic battery using electroplated nickel-63 on nickel foil as a power source," Nuclear Engineering Technology, pp. 1-5, 2016.

M Litz, W Ray, J Russo, S Kelley, and J Smith, "Planar Homojunction Gallium Nitride (GaN) P—i—N Device Evaluated for Betavoltaic Energy Conversion: Measurement and Analysis," ARL-TR-7801, US Army Research Laboratory, Sep. 2016.

Muhammad R. Khan et al., "Design and characterization of GaN p—i—n diodes for betavoltaic devices," Solid-State Electronics 136 (2017) 24-29.

J. Russo, M. Litz, W. Ray II, B. Smith and R. Moyers, "A radioluminescent nuclear battery using volumetric configuration: 63Ni solution/ZnS:Cu, Al/InGaP," Applied Radiation and Isotopes, vol. 130, pp. 66-74, 2017.

J. Russo, M. Litz, W. Ray II, G. M. Rosen, D. I. Bigio and R. Fazio, "Development of tritiated nitroxide for nuclear battery," Applied Radiation and Isotopes, vol. 125, pp. 66-73, 2017.

J. Russo, M. Litz, W. Ray II, S. Bayne, G. M. Rosen, H. Cho, J. Yu, D. I. Bigio, C. Thomas and T. R. Alam, "Demonstration of a Tritiated Nitroxide Nuclear Battery," Applied Radiation and Isotopes, vol. 144, pp. 93-103, 2019.

Kim et al., "Preparation of Ni-63 source for the fabrication of betavoltaic battery," Transaction of the Korean Nuclear Society Autumn Meeting, Gyeongju, Korea, Oct. 29-30, 2015.

* cited by examiner

ID BATTERIES AND
RADIOLUMINESCENT SURFACES

ELECTRODE WITH RADIOISOTOPE AND PHOSPHOR COMPOSITE LAYER FOR HYBRID RADIOISOTOPE BATTERIES AND RADIOLUMINESCENT SURFACES

RELATED APPLICATION DATA

This application is a divisional of U.S. patent application Ser. No. 16/366,792 filed Mar. 27, 2019, the disclosure of which is incorporated by reference its entirety for all purposes.

GOVERNMENT INTEREST

The embodiments herein may be manufactured, used, and/or licensed by or for the United States Government without the payment of royalties thereon.

FIELD

The present invention generally relates a process for forming radioluminescent surfaces. More particularly, embodiments of the present invention utilize an electrophoretic deposition process to form a composite layer of a radioisotope mixed with a radioluminescent phosphor on a substrate. In some embodiments, the substrate may be configured as an electrode for use in radioisotope batteries comprising a semiconductor which generate electrical energy through betavoltaic, beta-photovoltaic and/or photovoltaic processes.

BACKGROUND OF THE INVENTION

Present energy storage is substantially limited by the current chemical battery technology. This is due to both extensive infrastructure development over decades, and wide availability of components and materials in the commercial market. Chemical batteries have high power density and can easily power most commercial devices for brief time periods. However, chemical batteries suffer from charge leakage, temperature and environment sensitivity, as well as finite charge cycle limitations.

Radioisotope batteries have the potential to overcome these technical deficiencies. They are different from chemical batteries because they are independent, self-containing energy sources using radioisotope decay. They produce continuous power over a temperature range, meaning that they are not limited by diverse environmental conditions. Radioisotope battery energy densities are also several orders of magnitudes greater than current chemical batteries. They have the theoretical ability to remedy deficiencies in current technologies, as well as introducing new operational capabilities, because of higher energy density, thermal and mechanical robustness, and a vastly longer lifetime compared to commercially available chemical batteries.

Radioactive decay energy is converted to electrical energy using three main approaches: direct charge collection and contact potential difference, direct energy conversion, and indirect energy conversion. The most efficient of which is the direct energy conversion (DEC) using a betavoltaic ($\beta$V) cell configuration.

In practice, however, the $\beta$V cell configuration has suffered from major setbacks, including energy conversion efficiency, which is dependent on the semiconductor material quality and depletion-region volume, beta flux power related radioactivity per area, and effective mass density of the radioisotope carrier system.

Thus, indirect energy conversion using a $\beta$-PV cell configuration have been proposed which utilizes a two-step conversion process converting nuclear decay to optical energy through phosphor radioluminescence, and then, optical energy to electrical energy through photoelectric effect. Energy conversion efficiency is determined by the phosphor and photovoltaic cell efficiency. In practice, however, $\beta$-PV cell configuration using IDEC have suffered from major setbacks, including energy conversion efficiency and geometric constraints.

Thus, there is a need to provide higher power density and improved conversion efficiency.

SUMMARY OF INVENTION

According to embodiments, a method for forming a phosphor and radioisotope composite layer on a substrate by an electrophoretic deposition (EPD) process is provided. The method comprises: placing a substrate formed of conductive material and a counter electrode into a container; filling the container with an electrolyte solution having a radioluminescent phosphor particles and radioisotope particles dispersed therein; connecting the conductive substrate and a counter electrode to a power supply; performing EPD by applying a voltage to the conductive substrate and the counter electrode to apply a composite layer of radioluminescent phosphor with radioisotope particles homogeneously dispersed therein to the conductive substrate.

In various embodiments, the radioisotope may be a beta-particle emitter, such as Ni-63, H-3, Pm-147, or Sr-90/Y-90. And the radioisotope may be part of an inorganic or organic compound.

During EPD, the substrate is connected to the negative terminal of the power supply and the counter electrode is connected to the positive terminal of the power supply. By using the EPD process, the phosphor and radioisotope particles bond to the substrate without the need for any additional binder material. In addition, the method may further comprise: coating a surface of the substrate with a photoresist material; applying a pattern defining a cell to the coated surface using a photolithography process and applying, via the EPD process, the layer of radioluminescent phosphor with radioisotope particles homogeneously dispersed within the phosphor layer to the substrate to only the patterned area(s) of the substrate. The method may also include mixing or agitation the electrolyte solution to suspend the phosphor and radioisotope particles therein.

In some exemplary embodiments, (i) the phosphor particles in the electrolyte solution may range in size from about 100 nm to 20 microns in diameter; (ii) the radioisotope particles in the electrolyte solution may range in size from about 10 nm to 1 micron in diameter; (iii) the concentrations of the radioluminescent phosphor particles and the radioisotope particles in the EPD solution are about 75 and 25 wt/wt %, respectively; (iv) the thickness of the composite layer formed on the substrate by the EPD process may be between about 10 microns to 150 microns thick; (v) the packaging density range of the composite layer produced by the EPD process may be between about 1.8 to 2.1 g/cm$^3$; (vi) the surface uniformity of the composite layer produced by the EPD process may be about ±10 microns; and (vii) the composite layer produced by the EPD process may be substantially planar and may provide an optical power output of approximately 50 nW/cm$^2$.

In embodiments where energy is harnessed, the substrate may comprise a semiconductor configured to absorb beta particles and/or photons and outputting electrical energy.

And the electrode may be configured as a betavoltaic or beta-photovoltaic cell having a thicknesses range between about 25 to 100 microns, including the substrate layer thickness.

In embodiments where a radioluminescent surface is produced, the conductive substrate may be comprised of graphene or indium tin oxide (ITO) on quartz, glass, or sapphire with thicknesses between 0.3 to 1 nm and 100 to 200 nm, respectively.

According to further embodiments, an electrode for beta-photovoltaic cells is provided. The electrode may comprise: a substrate formed of a conductive layer with a thickness ranging between about 10 nm to 1 micron; a composite layer of radioluminescent phosphor with radioisotope particles homogeneously dispersed therein formed on conductive substrate with a thickness ranging between about 1 and 25 microns; and a semiconductor comprising a P-i-N/P-u-N junction or a N-i-P-P junction.

In the case that the semiconductor comprises a P-i-N/P-u-N junction, it may be comprised of: a GaN or sapphire substrate with a thickness range from 100 nm to 350 μm; a first layer of AlGaN or GaN N-template approximately 4 μm in thickness formed on the substrate; a second layer of N—AlGaN approximately 480 nm in thickness formed on the first layer; a third layer of u-AlGaN or i-AlGaN approximately 480 nm in thickness formed on the second layer; and a fourth layer of P—AlGaN approximately 50 nm in thickness formed on the third layer and which the composite layer is formed on. In some instances, the P-i-N/P-u-N junction dopant concentrations are 4E17 atoms/cm$^3$ for the further layer of P—AlGaN, 1E16 atoms/cm$^3$ for the third layer of u-AlGaN, and 1E18 atoms/cm$^3$ for the second layer of N—AlGaN.

In the case that the semiconductor comprises a N-i-P-P semiconductor junction, it may be comprised of: a GaAs P-Substrate approximately 350 μm in thickness; a first layer of P—GaAs approximately 200 nm in thickness formed on the substrate; a second layer of a InGaP buffer layer approximately 50 nm in thickness formed on the first layer; a third layer of P—InGaP approximately 2000 nm in thickness formed on the second layer; a fourth layer of i-InGaP approximately 10 nm in thickness formed on the third layer; and a fifth layer of N—InGaP approximately 50 nm in thickness formed on the fourth layer and on which the composite layer is formed on. In some instances, the N-i-P-P junction dopant concentrations may be 1E18 atoms/cm$^3$ for the fifth layer of N—InGaP, 1E16 atoms/cm$^3$ for the fourth layer of i-InGaP, and 5E16 atoms/cm$^3$ for the third layer of p-InGaP.

These and various other embodiments, objects, features, aspects and advantages of the inventive subject matter will become more apparent from the following detailed description of preferred embodiments, along with the accompanying drawing figures in which like numerals represent like components.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only illustrative embodiments of this invention and are therefore not to be considered limiting of its scope, for the invention may admit to other equally effective embodiments.

Figure 1:
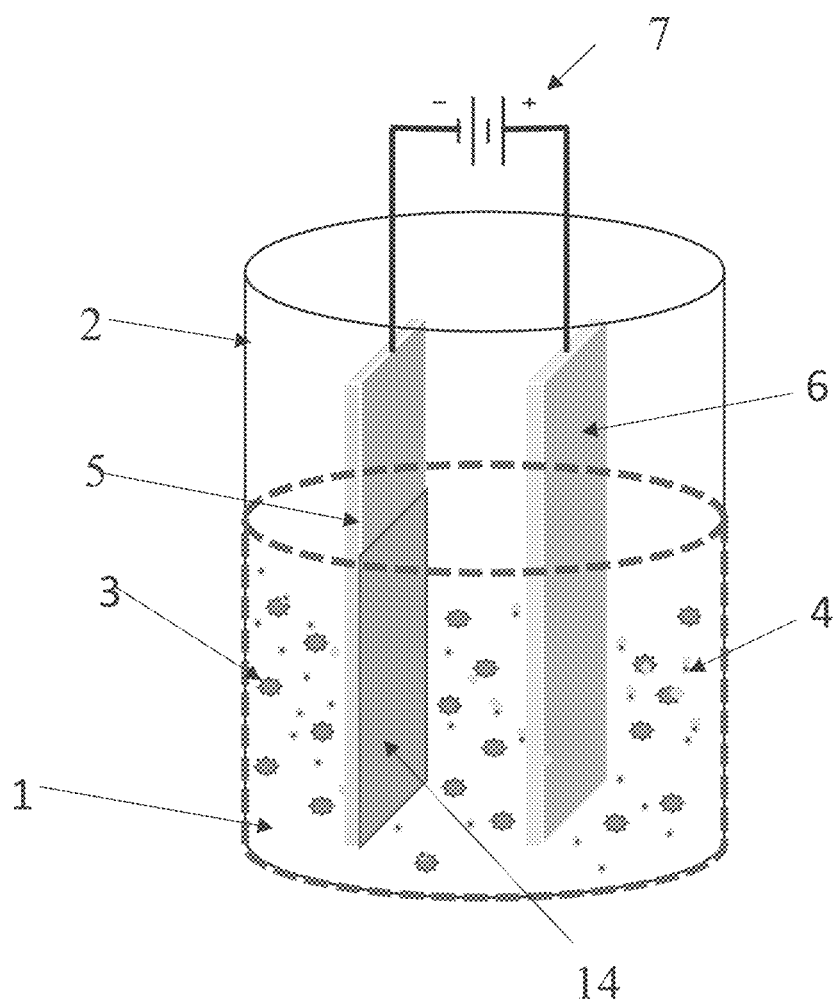
FIG. 1 is a schematic of the EPD process for forming a phosphor and radioisotope composite layer on a conductive surface of optically translucent or transparent substrate according to embodiments of the present invention.

To facilitate understanding, identical reference numerals have been used, where possible, to designate comparable elements that are common to the figures. The figures are not drawn to scale and may be simplified for clarity. It is contemplated that elements and features of one embodiment may be beneficially incorporated in other embodiments without further recitation.

The discussion which follows provides a detailed description and example embodiments of the inventive subject matter with reference to the accompanying figures mentioned above.

DETAILED DESCRIPTION

Novel electrophoretic deposition (EPD) processing forms a composite layer of a radioisotope and a radioluminescent phosphor on a conductive substrate. The substrate may be a surface of optically translucent or transparent substrate. In the composite layer formed, particles of the radioisotope particles are homogeneously dispersed with the radioluminescent phosphor. The composite layer forms one or more radioluminescent surfaces. In such embodiments, the mixture can be directly deposited by EPD on the substrate surface.

The EPD processing may be advantageous for manufacturing radioisotope batteries with the substrate in which the composite layer is applied and forms on an electrode. In some embodiments, the electrode may be comprised of a semiconductor configured to generate electrical energy. Some of the radioactive particles and/or photons can reach the semiconductor, the top surface(s) of the substrate should be optically translucent or transparent.

The radioisotope is the energy source and the phosphor and semiconductor are the energy converters. The semiconductor converters can be planar and/or made of high aspect ratio microstructures because of the advantageous capability of the EPD process. The phosphor and radioisotope mixture configuration provide high radioactivity per volume and power density through three-dimensional (3D) interaction between the radioactive source, phosphor, and high aspect ratio microstructure semiconductor transducer. In other applications and embodiments, the radioisotope and phosphor mixture are deposited by EPD on a conductive transparent surface for use as a light source such as signs and visible indicators.

Mixing and deposition of radioisotope and phosphor mixture can be low cost, practical, and provide for ease of manufacture. The mixture can be selectively deposited or applied to any surface and form factor through lithographic techniques.

The combination of the composite layer of radioisotope and radioluminescent phosphor mixture formed on the semiconductor converter allows it to power electronic solid-state devices, mobile devices, medical devices, unattended sensors, spacecraft instruments, micro-electrical-mechanical systems (MEMS), explosives monitoring, and microprocessors for decades.

The EPD process provide greater three-dimensional (3D) interaction between the two radioisotope and phosphor particles. In addition, conversion efficiency can be improved by converting radioactive emission particles, optical emissions (i.e., photons), or a combination of both, in a suitable semiconductor device structure with the use of a direct wide bandgap material.

FIG. 1 is a schematic of the EPD process for forming a phosphor and radioisotope composite layer on a conductive surface of optically translucent or transparent substrate according to embodiments of the present invention. This process directly deposits the composite layer directly on the substrate without the need for any additional binder material.

The EPD electrolyte 1 is an electrical conductive solution. It is held in a container 2. In one exemplary embodiment, the EPD electrolyte 1 may be composed of a solution such as an isopropyl alcohol (IPA) bath with a nitrate salt of $Mg(NO_3)_2 \cdot 6H_2O$ at a concentration of $\approx 1.6E-4$ M. Other electrolyte solutions include ethanol, butanol, methanol, and water to name a few. Added salt in solution is dissolved during sonication and stirring in the container 2. The salt should be dissolved before active material is added to solution for adequate deposition layers.

The radioluminescent phosphor 3 and radioisotope particles 4 are mixed in the electrolytic solution 1 at certain specified concentrations that are appropriate for application. A non-limiting example of concentration is 75/25 wt/wt % of phosphor and radioisotope, respectively.

In various embodiments, the radioluminescent phosphor 3 used in the EPD process preferably comprises nano- and micron-sized particles ranging from about 100 nm to 20 microns. Examples include infrared-, visible- and ultraviolet-light emitting phosphors include, for instance, zinc sulfide doped with copper or silver, strontium aluminate europium and dysprosium doped, and lanthanum phosphate doped with praseodymium.

The radioisotope 4 is selected for a particular application in mind. Radioisotopes decay through three types of particle emission: beta (electron or positron), alpha (atomic nucleus emission), and gamma (electromagnetic radiation).

Beta emitting radioisotopes are the most appealing candidates for energy sources, as they do the least amount of damage to the semiconductor (converter) and to the environment. Thus, according to preferred embodiments, the radioisotopes 4 used in the EPD process are beta-emitter, such as Ni-63, H-3, Pm-147, or Sr-90/Y-90. The radioisotopes may be in elemental or metallic form, but various salts compounds (both inorganic and organic) may be also, such as salts, hydrides, and oxides, to name a few. Indeed, as tritium, H-3, is normally a gas, a tritiated organic compound or a metal compound of H-3 such a metal hydride could be used. An example of the tritiated organic compound is the tritiated nitroxide free radical and trioxylamine. Large macromolecules, such as polymers, including the radioisotopes may also be used. The radioisotopes 4 particles should be solid or dissolvable in electrolytic solution. Established radioisotope particles and their production are generally known in the art. Different chemical synthesis will be involved to produce various radioisotope particles. The radioisotope 4 particles in the electrolyte solution 1 may range in size from about from 10 nm to 1 micron in diameter, for instance.

The EPD solution 1 may be agitated through sonication and/or stirring, for instance, thus suspending particles of the radioluminescent phosphor 3 and radioisotope 4. Container 2 should be of sufficient size to hold the EPD solution 1 and the electrodes 5 and 6. The deposition electrode or substrate 5 and counter electrode 6 are placed in electrolytic solution 1. Agitation can be intermittently or continually applied as needed.

The deposition electrode or substrate 5 is a conductive, optically transparent material. It may further be configured as a semiconductor device for harnessing energy output from the composite layer; such embodiments are later discussed. The counter electrode 6 should also be conductive; although, its size and shape are not generally important. The composite layer 14 may be formed on all or some portion(s) of the substrate 5 generally facing the counter electrode 6. In further embodiments, photolithography may be used to selective pattern the surface of the substrate as discuss below with respect to FIGS. 8 and 9.

During the EPD process, the deposition electrode or substrate 5 is connected to the negative terminal of the DC power supply 7 and the counter electrode 6 is connected to the positive terminal of the power supply 7. The electrode separation distance can be altered for user application and deposition rate. Sufficient voltage is applied to effectuate the EPD process.

The composite layer 14 is deposited directly on deposition electrode or substrate 5 using EPD. For example, using ZnS:Cu,Al with average particle size diameter of 4 microns and a Ni-63 average particle size diameter of 500 nm, the average bulk density is about 2.1 $g/cm^3$ applied using the EPD process. The composite layer 14 is considered a volumetric configuration or light source in that the EPD process creates a homogenous mixture of nanoparticle radioisotope 8 in a phosphor matrix 9. The composite layer 14 thickness may range between about 100 nm to 100 microns depending on beta-emitting radioisotope particle size. When the composite layer thickness is sub-micron, the coating may be translucent or opaque. In addition, surface uniformity is high, meaning there is less differentiation in layer thickness over substrate surface area. For example, the EPD surface uniformity may be approximately ±10 microns.

Isotropic beta particle emission 10 creates isotropic photon emission 11 in phosphor through radioluminescence. Since the radioisotope nanoparticles are embedded in phosphor layer, a higher amount of photons are created in the volumetric due to greater interaction between radioisotope and phosphor. Volume radioactivity and phosphor thickness 11 can be greater than thin film phosphor thickness 12 because of greater photon range 11 in volume compared to beta range. There is less photon attenuation in the phosphor, thus more photons can exit the volume compared to a thinner phosphor layer 12. Volumetric configuration 13 has a greater energy and power density than the two-dimensional thin-film configuration because more photons are produced in the larger volume. Volumetric configuration 13 overcomes geometric constraints from thin film configuration by spreading radioisotope throughout phosphor matrix. The optical power can be increased with the volumetric configuration using the EPD process. For example, using Ni-63 with ZnS:Cu,Al produces approximately 50 nW/cm².

In general, the deposition rate can be increased through an increase in DC voltage (VDC) across the electrodes and/or reducing the separation distance of the electrodes.

Figure 2:
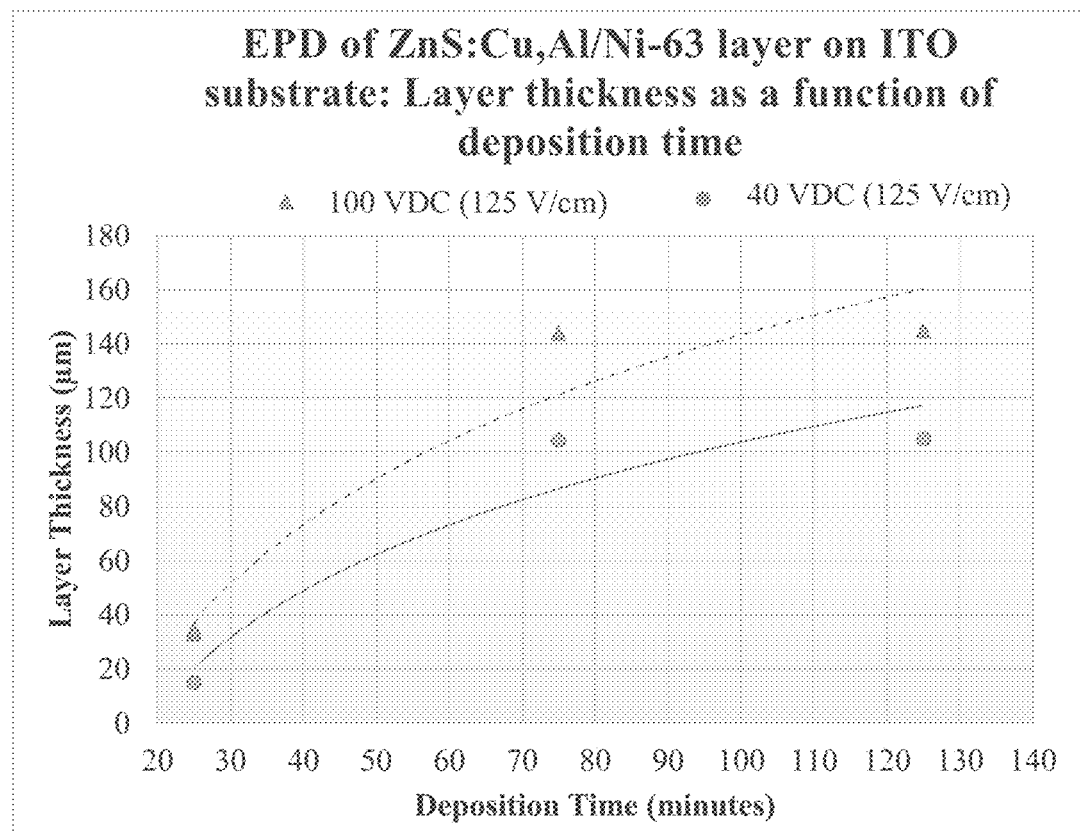
FIG. 2 is a plot of composite layer thickness formed of $^{63}$Ni particles and ZnS:Cu,Al phosphor particles applied on an indium-tin-oxide (ITO) substrate by EPD.

FIG. 2 is a plot of composite layer thickness formed of $^{63}$Ni particles and ZnS:Cu,Al phosphor particles applied on an indium-tin-oxide (ITO) substrate by EPD. The plot show two electrical potential sets for 40 and 100 VDC. Higher electrical potential between electrodes increases deposition rate. Both sets appear to show a saturation trend at the nearly same deposition time.

The deposition electrode or substrate 5 which the composite layer 14 was applied and counter electrode 6 were spaced apart with a separation distance of 8 millimeters. This phenomenon will change with alteration of electrode, phosphor, radioisotope, and electrolytic solution type, electrode separation distance, electrolytic solution agitation process, and voltage.

Figure 3:
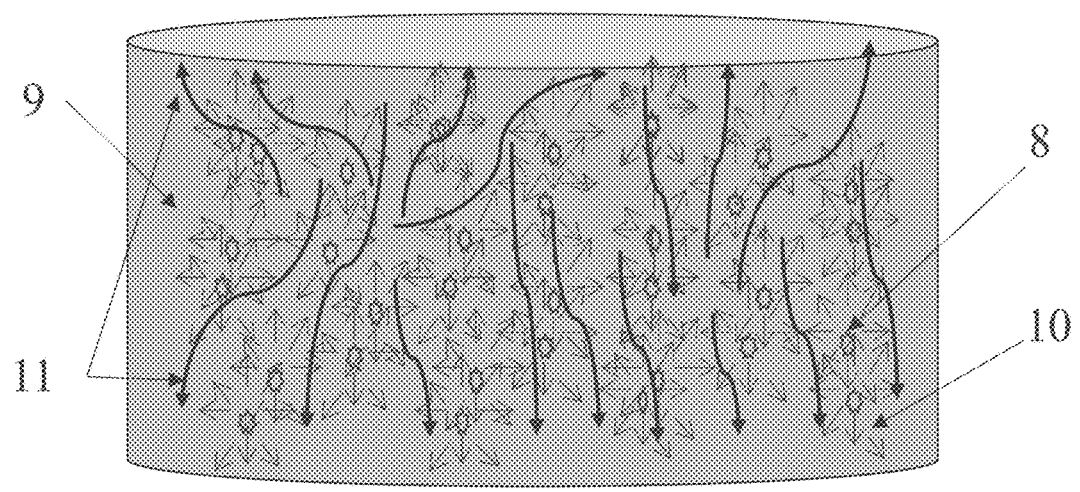
FIG. 3 is an illustration of a composite layer applied by EPD according to embodiments of the present invention and the internal interactions.

FIG. 3 is an illustration of a composite layer applied by EPD according to embodiments of the present invention and the internal interactions. It is comprised of beta-radioisotope nanoparticles 8 and radioluminescent phosphor. Since the phosphor is in much larger quantity than the beta-radioisotopes, it form a matrix 9. The radioisotope nanoparticles 8, through radioactive decay, emits beta particle emissions 10. The beta particle emissions 10 react with the radioluminescent phosphor to emit photon emissions 11. The spectral characterization of the photon emissions 11 will depend of the particular radioluminescent phosphor selected. Both beta and photon emissions are isotropic.

The volumetric configuration of the beta-radioisotope nanoparticles in radioluminescent phosphor matrix provides a great deal of interaction between phosphor and radioisotope. The photon range is greater than beta range in material because less photon attenuation. Photons are able to travel deeper in phosphor matrix with minima attenuation of about 50 to 100 microns. Beta particles from 1 to 16 keV are only able to penetrate about 1 to 20 microns in phosphor layer depending on mass and bulk density.

Figure 4:
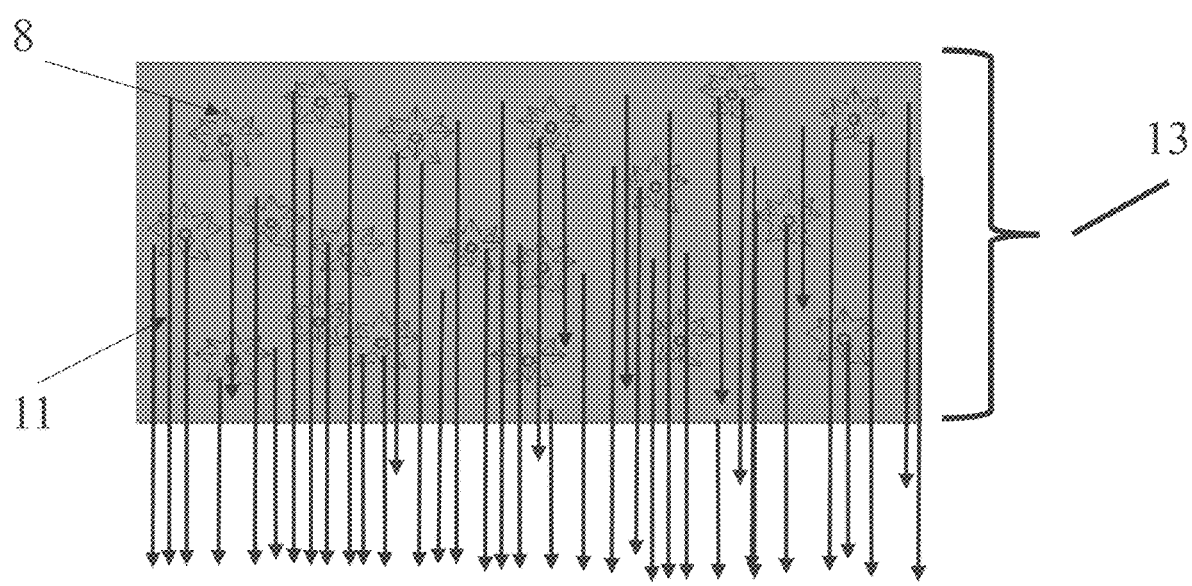
FIG. 4 shows a composite layer applied by EPD according to embodiments of the present invention and the net external effect.

FIG. 4 shows a composite layer applied by EPD according to embodiments of the present invention and the net external effect. Many photons are created in volumetric configuration due to three-dimensional interaction between phosphor and radioisotope nanoparticles 8 which are output. The thickness 13 of the composite layer is selected to emit substantially only photons 11.

Figure 5:
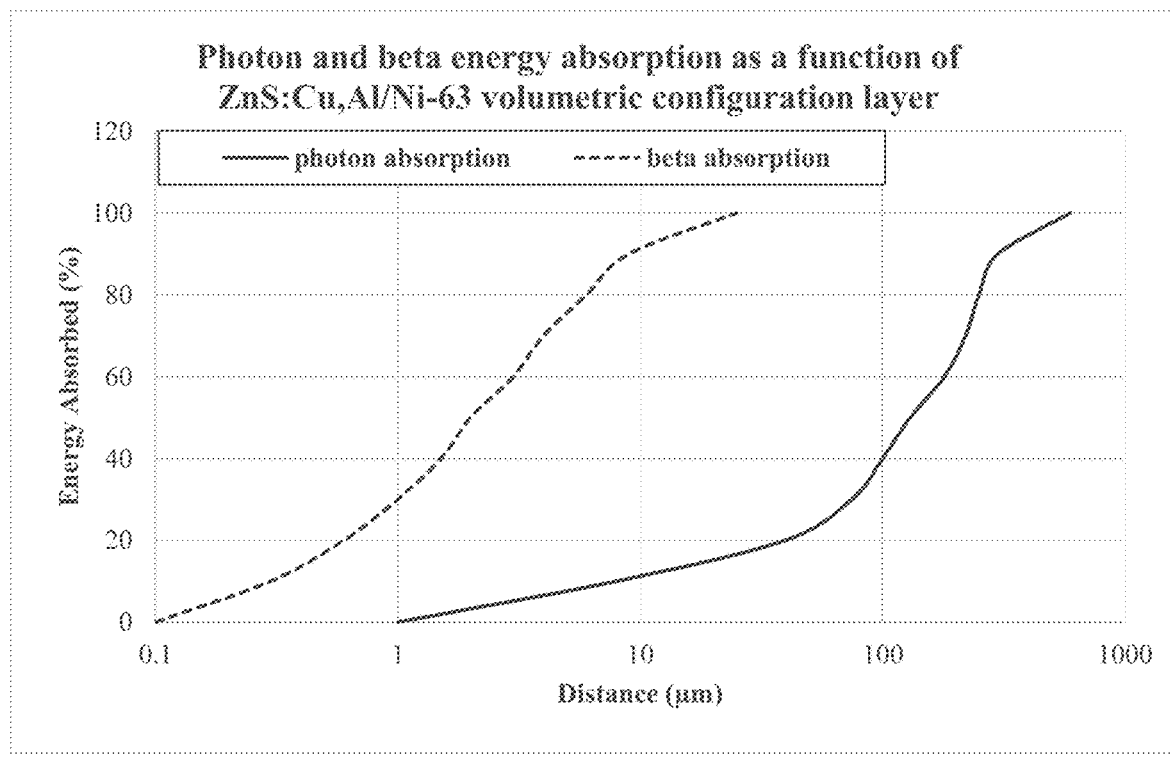
FIG. 5 is a plot of photon and beta energy absorption as a function of ZnS:Cu,Al/Ni-63 volumetric configuration composite layer.

FIG. 5 is a plot of optical (photon) and beta energy absorption as a function of distance (or thickness) of the composite layer formed by EPD. For the data presented, ZnS:Cu,Al/Ni-63 volumetric composite layer was formed on an electrode using the EPD process. The Ni-63 was in the form of the salt, nickel-63 chloride ($^{63}$NiCl$_2$). The Ni-63 emits beta particles. The three-dimensional interaction of beta particles from the Ni-63 creates photons from the phosphor particles through ionization processes (radioluminescence).

The measured energy penetration depth in ZnS:Cu,Al for beta particle emission from Ni-63 and photon (525 nm wavelength) shows that photons have a greater range before being absorbed in the phosphor. Emissions by both mechanisms occur between a range of approximately 1 to 25 microns layer thickness, which is considered the overlapping region.

The beta particle penetration depth for 90% of the beta energy to be absorbed in the ZnS:Cu,Al at bulk density of 2.1 g/cm³ is approximately 10 microns with nickel-63 chloride ($^{63}$NiCl$_2$). This would normally limit the ZnS:Cu,Al layer thickness to approximately 10 microns. However, by mixing the radioisotope with the phosphor, the beta particles produce photons in the layer that can travel approximately 400 to 500 microns before being 90% self-absorbed. The increase of layer thickness by 40× enables an increase in the energy deposited and the energy converted for a higher electrical power output. A unique feature of the EPD process is that the composite layer thickness can be modified to maximize both optical (photon) and beta penetration depths, and thereby maximize electrical power out of the device.

By judiciously configuring the electrode 5 and the composite layer 14 together, the energy output from the composite layer 14 can be efficiently harnessed by the electrode 5 in a radioisotope battery. The thickness of composite layer 14 determines if the device is a betavoltaic (β-V), beta-photovoltaic (β-PV) or photovoltaic (PV) cell radioisotope battery based on its output. For the data shown in FIG. 5, a thinner composite layer (e.g., 0-1 µm) emits primarily beta particles 15, whereas a thicker composite layer (e.g., above ~25 µm) emits primarily only photons 11, 16. In between (~1-25 µm), the composite layer 14 emits some combination of both beta particles 15 and photons 11, 16.

Direct bandgap semiconductors convert beta particles and/or photons into usable electrical energy. Depending on the radioisotope battery configuration, betavoltaic, beta-photovoltaic and/or photovoltaic processes occur. The radioisotope battery may be composed of multiple cells electrically connected in series or parallel.

The radioactive isotope particles emit beta particles, which are similar to electrons. Suitable energy conversion processes may be employed by a suitable semiconductor depending of the external emission of the composite layer 14. As previously stated, based on its thickness, the composite layer 14 may emit photon, beta particles, or some combination thereof.

A betavoltaic process may be used to convert beta particles to electrical energy, a beta-photovoltaic process to covert beta particles and photons to electrical energy, and a photovoltaic processes to covert photons to electrical energy. Energy conversion efficiency is determined by the phosphor and photovoltaic cell efficiency. For example, a geometric constraint is the limited interaction between the converter and radioactive material. The most efficient of these is the direct energy conversion using a betavoltaic cell (βV) configuration. But, there may be other reasons to use the other approaches.

Phosphor emitted photons can be absorbed by a photovoltaic cell, such a PN semiconductor junction. Indirect energy conversion is determined by the interaction between the radioisotope material and the two converters: phosphor and photovoltaic cell. The phosphor layer is an energy medium between beta particles and PN junction limiting the magnitude of radiation damage and converting the entire beta spectrum into usable photons, especially, when using higher beta energy radioisotope sources such as Sr-90/Y-90 and Pm-147.

Beta emissions may be harnessed by a suitable semiconductor materials through the carrier system, such as a Schottky diode, PN junction semiconductor, P-i-N/P-u-N junction semiconductor, or N-i-P-P junction semiconductor. Similar to photovoltaic cells, electron-hole pairs (e-h-ps or ehps) are created by the ionization trails of the incident beta particles inside or within a minority carrier diffusion length of the depletion region. They are separated by the built-in electric field from P-type junction and N-type junction; electron hole pairs (ehps) are drifted are apart. The gathering of separated ehps in the neutral region of the semiconductor where the electrons are on the N-junction side and the holes are on the P-junction side results in the junction becoming forward biased and current flowing through an externally connected load.

Beta-photovoltaic (β-PV) conversion uses a two-step conversion process to convert (i) nuclear decay to optical energy through phosphor radioluminescence, and then, (ii) optical energy to electrical energy through photoelectric effect in a PN-junction photovoltaic cell. As used herein, the term "hybrid" may be used to refer to semiconductor capable of converting both betas and photons into usable electrical energy following typical processes of both photovoltaic (PV) and betavoltaic (βV) devices.

Variation of the thickness of the radioisotope and phosphor composite layer 14 allows an electrode for a hybrid radioisotope battery to be developed, taking advantage of both DEC and DEC. Radioisotopes, such as Ni-63 and Pm-147, are solid at STP and emit higher energy beta particles (18-250 keV) that are more suitable for β-PV and βV configuration and light sources.

The EPD process described herein, when used with phosphors mixed with beta-emitting radioisotopes, enables a hybrid radioisotope battery to be created in some embodiments and optimized for power output and material costs. For example, the EPD process enables varying thickness optimization of the phosphor and radioisotope mixture/composite to be created on the surface of the electrode substrate, such as InGaP semiconductor.

Figure 6A:
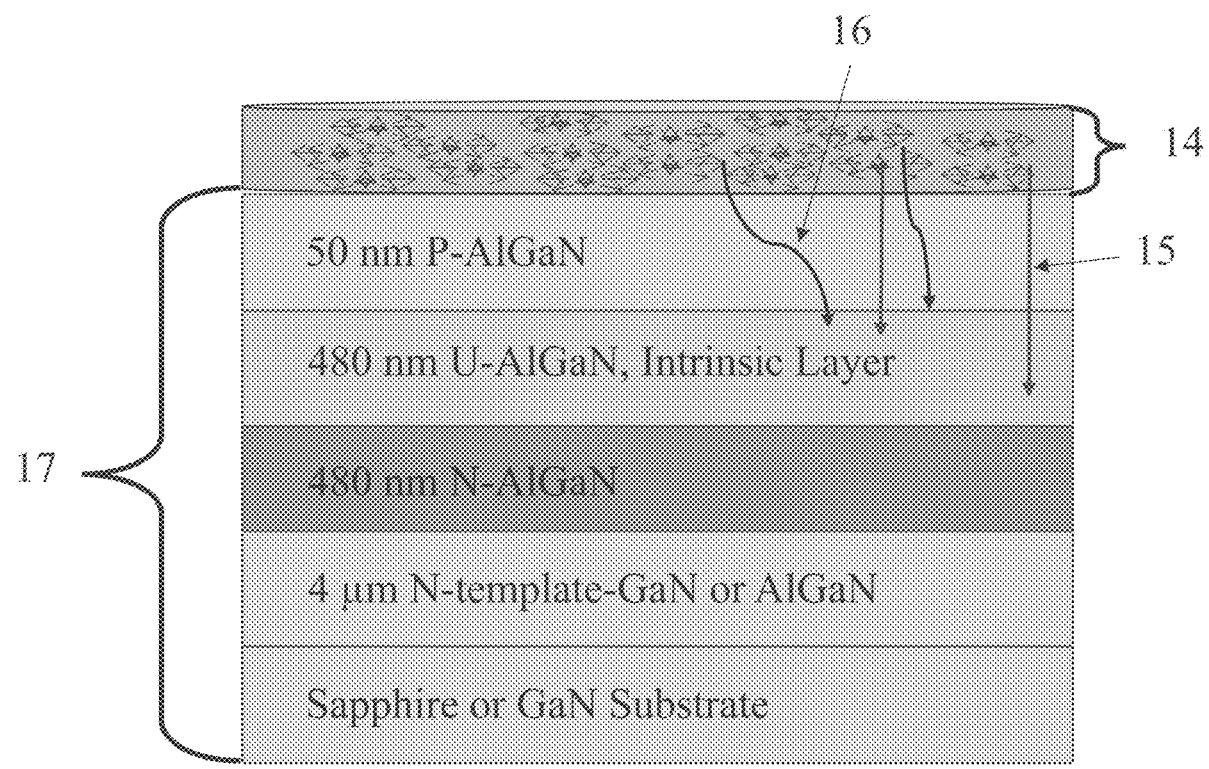
FIGS. 6A and 6B are illustrations of hybrid radioisotope battery using beta-photovoltaic and betavoltaic energy conversion with volumetric configuration.
Figure 6B:
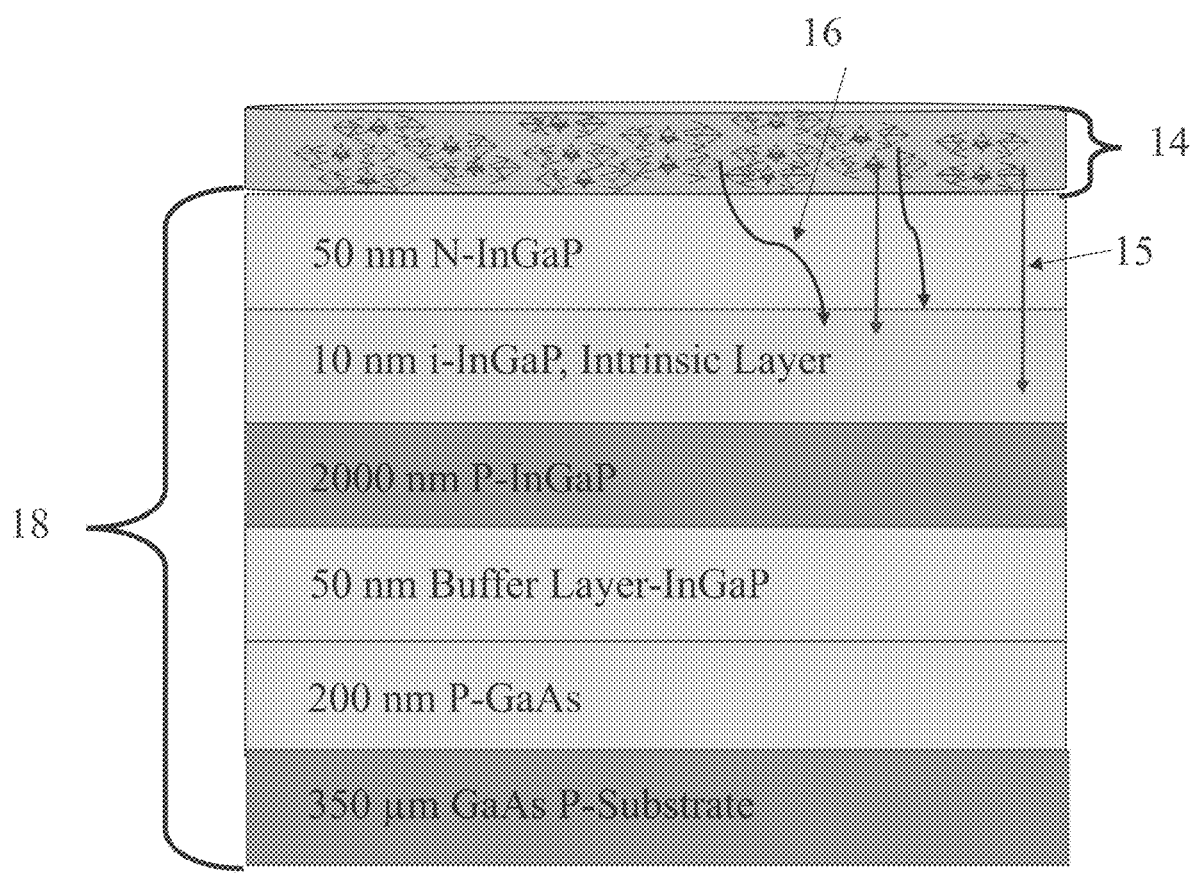

FIGS. 6A and 6B show two hybrid radioisotope battery embodiments which use beta-photovoltaic and betavoltaic energy conversion with a volumetric configuration according to embodiment. In these drawings, the nomenclature i/I represents the intrinsic layer and u/U represents the undoped layer. In the semiconductor field, they are used to represent the same layer or junction. Thus, P-i-N or P-u-N refer to the same type of junction.

The hybrid radioisotope battery in FIG. 6A includes a P-i-N or P-u-N junction semiconductor 17, such as mc-Si, a-Si, GaAs, InGaP, GaP, GaN or AlGaN (direct wide bandgap semiconductors). It is configured for a composite layer which emits a combination of beta particles and photons. The P-i-N/P-u-N junction is comprised of: a GaN or sapphire substrate with a thickness range from 100 nm to 350 µm; a first layer of AlGaN or GaN N-template approximately 4 µm in thickness formed on the substrate; a second layer of N—AlGaN approximately 480 nm in thickness formed on the first layer; a third layer of u-AlGaN or i-AlGaN approximately 480 nm in thickness formed on the second layer; and a fourth layer of P—AlGaN approximately 50 nm in thickness formed on the third layer and which the composite layer is formed on. For example, the dopant levels of AlGaN device are 4E17 atoms/cm$^3$ for p-AlGaN, 1E16 atoms/cm$^3$ for u-AlGaN, and 1E18 atoms/cm$^3$ for n-AlGaN.

The hybrid radioisotope battery in FIG. 6B is configured for a thicker composite layer which emits just photons. It includes a N-i-P-P junction semiconductor 18, such as GaP, InGaP, GaAs, a-Si, and mc-Si. The N-i-P-P junction 18 is comprised of a GaAs P-Substrate approximately 350 µm in thickness; a first layer of P—GaAs approximately 200 nm in thickness formed on the substrate; a second layer of a InGaP buffer layer approximately 50 nm in thickness formed on the first layer; a third layer of P—InGaP approximately 2000 nm in thickness formed on the second layer; a fourth layer of i-InGaP approximately 10 nm in thickness formed on the third layer; and a fifth layer of N—InGaP approximately 50 nm in thickness formed on the fourth layer and on which the composite layer is formed on. For example, the dopant levels of InGaP device are 1E18 atoms/cm$^3$ for n-InGaP, 1E16 atoms/cm$^3$ for i-InGaP, and 5E16 atoms/cm$^3$ for p-InGaP.

In both embodiments, electron hole pairs are created and collected causing an electric potential difference. Non-conductive surfaces will either be partially or not covered by composite coating using EPD process.

Figure 7A:
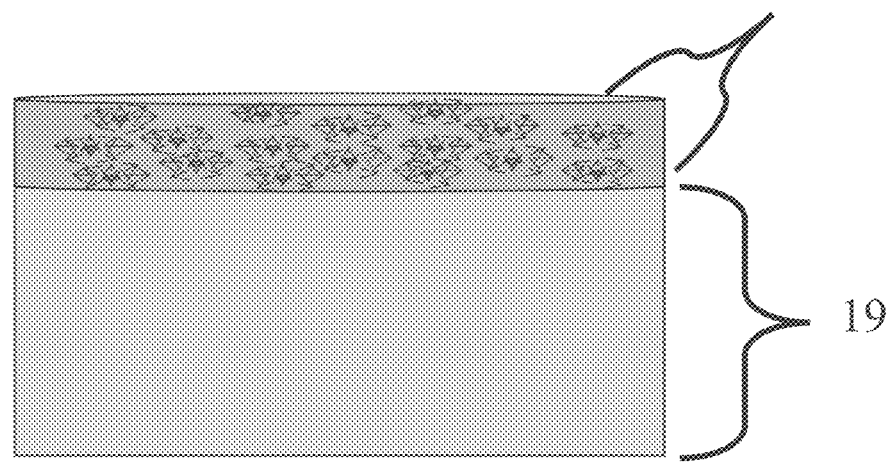
FIGS. 7A and 7B are illustrations of deposition on planar and three-dimensional/high aspect ratio semiconductor junction structures. The illustrations are cross sections.
Figure 7B:
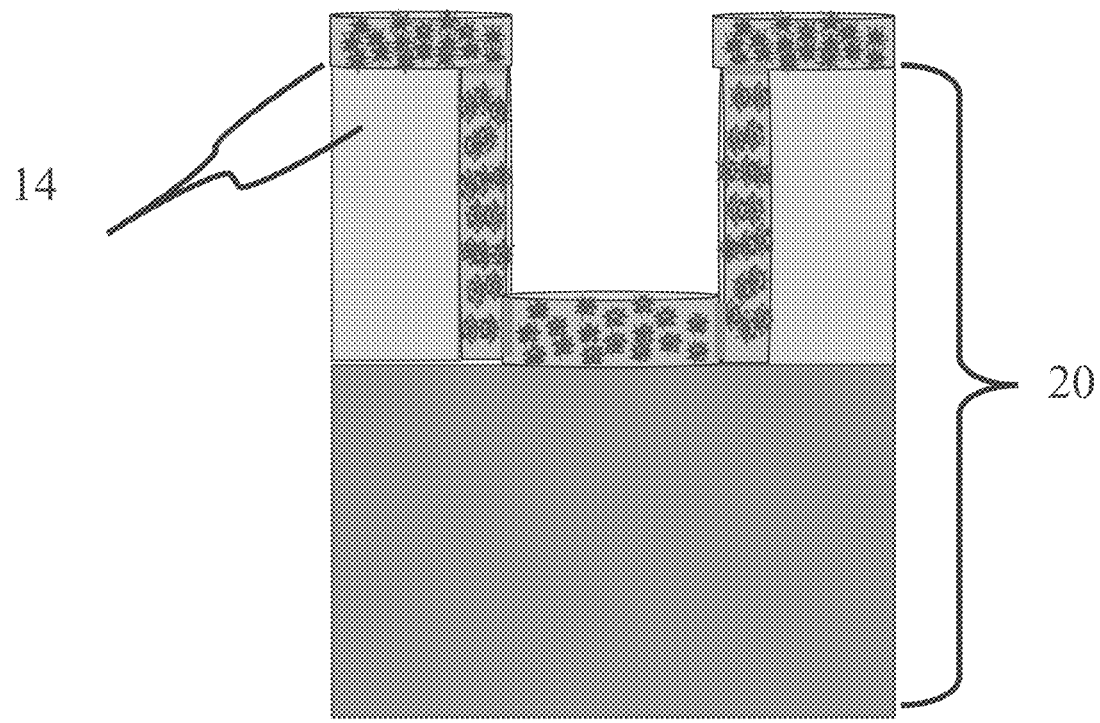

The EPD process can deposit radioisotope and phosphor composite layer on specific individual devices of wafer. FIGS. 7A and 7B show two such applications. Composite layers 13, 14 can be directly deposited on various conductive surfaces with different aspect ratios such as planar 19 structure (FIG. 7A) or a pillared 20 structure (FIG. 7B). A honeycombed structure could similarly be produced.

In some embodiments, a photolithography process is used in microfabrication to pattern certain area of the substrate with thin light-sensitive chemical "photoresist" material. Photolithography is generally known in the art.

Figure 8:
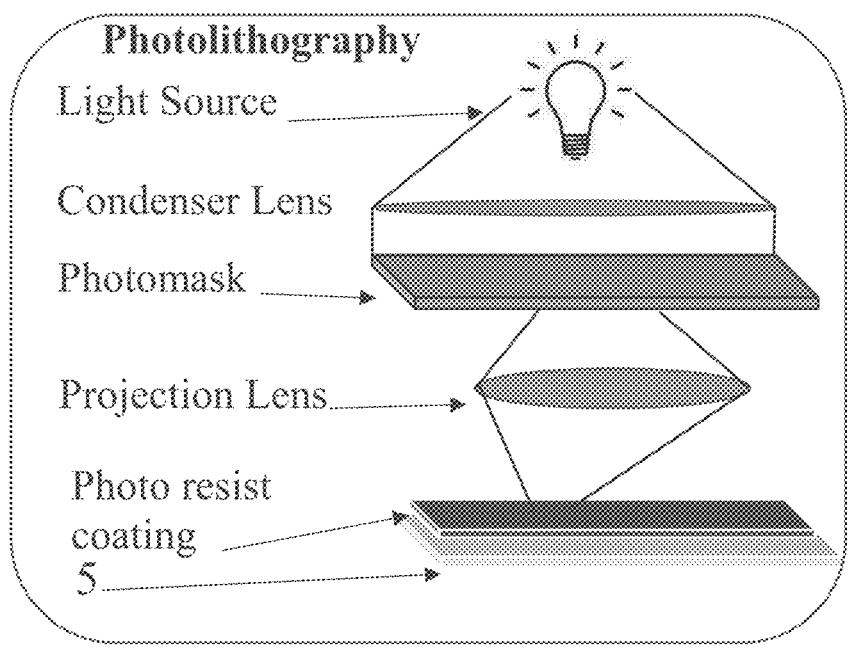
FIG. 8 is a process flow chart of radioisotope battery patterned by photolithography.
Figure 8:
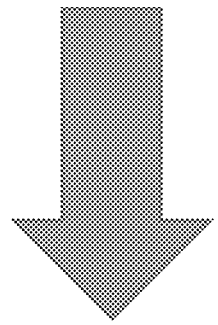
Figure 8:
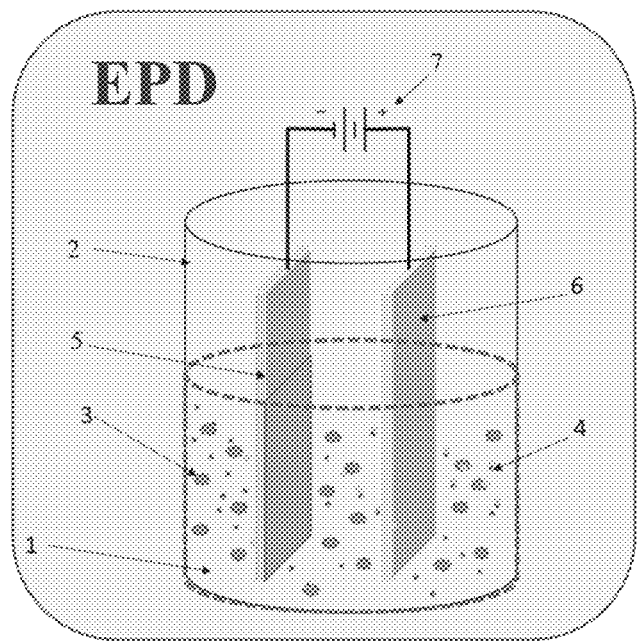

FIG. 8 shows a process of how the patterning a deposition electrode or substrate by photolithography. First, a substrate wafer is prepared and cleaned, for instance, by a wet chemical treatment. Photoresist is applied on wafer surface, such as, through spin coating. The spin coating typically runs at 1200 to 4800 rpms for 10 to 30 seconds producing a layer between 100 nm to 1 micron. The spin coating process results in a thin layer with uniformity of within 5 to 10 nm. The photo resist-coated wafer is then prebaked to get rid of excess photoresist solvent laying on the top, typically at 90 to 100° C. for 30 seconds on hotplate. The photo resist-coated wafer is then exposed to a pattern of intense light and removed using a special solution called a "developer".

Figure 9:
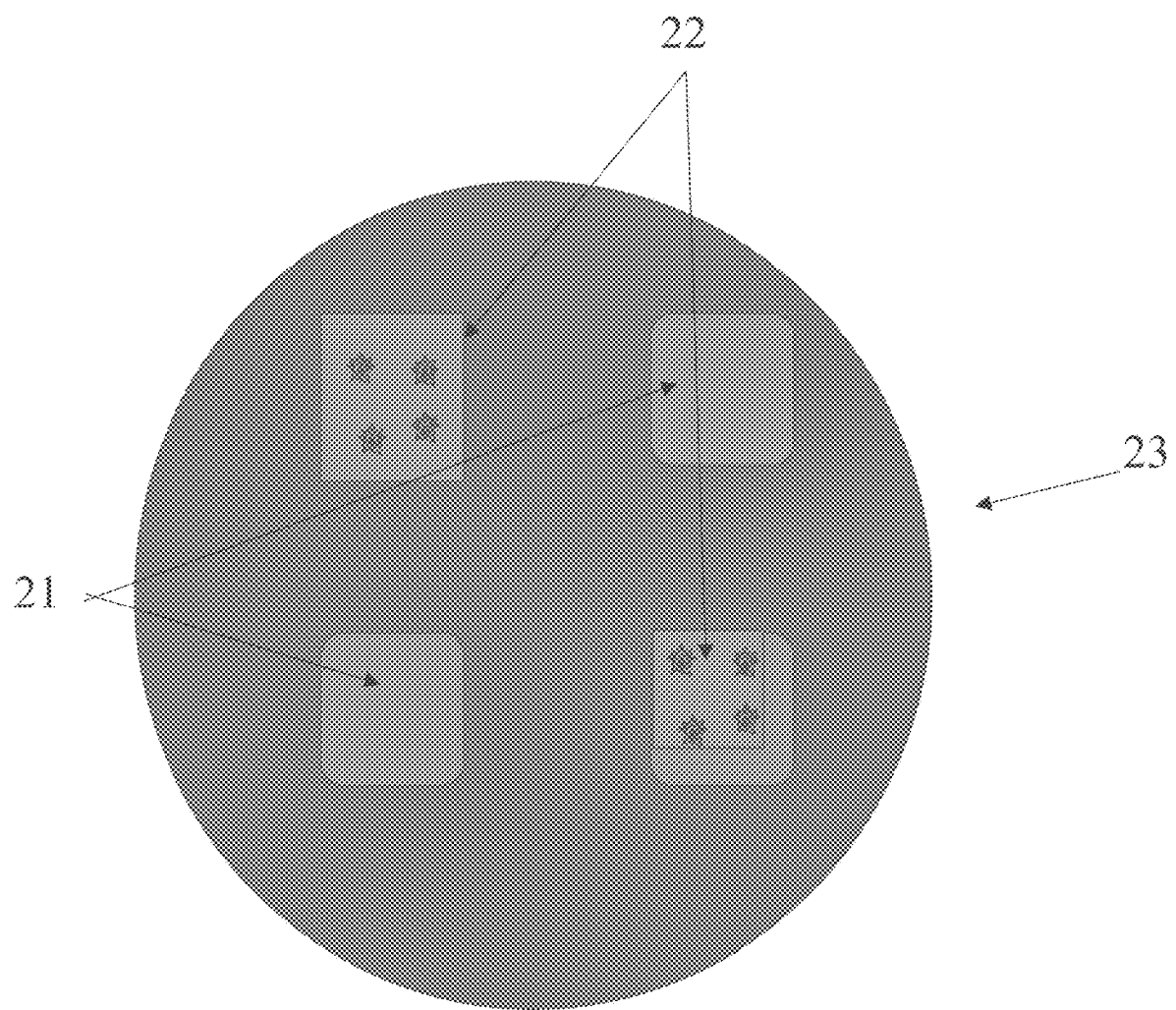
FIG. 9 is a schematic illustration of the EPD process to select what devices are beta-photovoltaic and betavoltaic cells.

As shown in FIG. 9, exposed areas 21 are the conductive areas of the wafer, whereas areas 22 covered with the photoresist are non-conductive. The photo resist-coated wafer, used as the deposition electrode or substrate 5, along with a counter electrode are placed in electrolytic solution for EPD process. Composite layer is deposited on exposed areas 23.

In addition, composite layer can be deposited on a single device through electrical connection of P-layer, which is a unique junction for each device. Typically, semiconductor devices have common N-layer or junction. If N-junction is electrically connected during EPD process, all exposed areas are coated with composite layer.

Figure 10A:
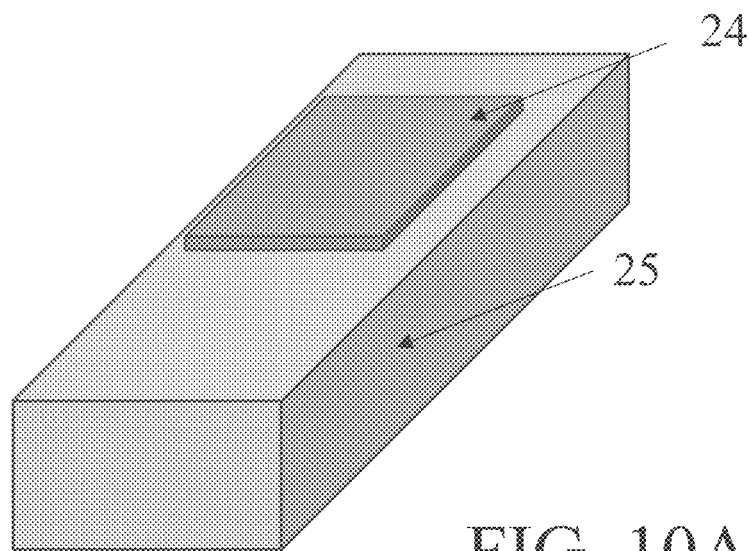
FIGS. 10A and 10B are illustrations of hybrid radioisotope battery powering unattended sensor and microprocessor for aerospace, terrestrial applications, and onboard PCB power.
Figure 10B:
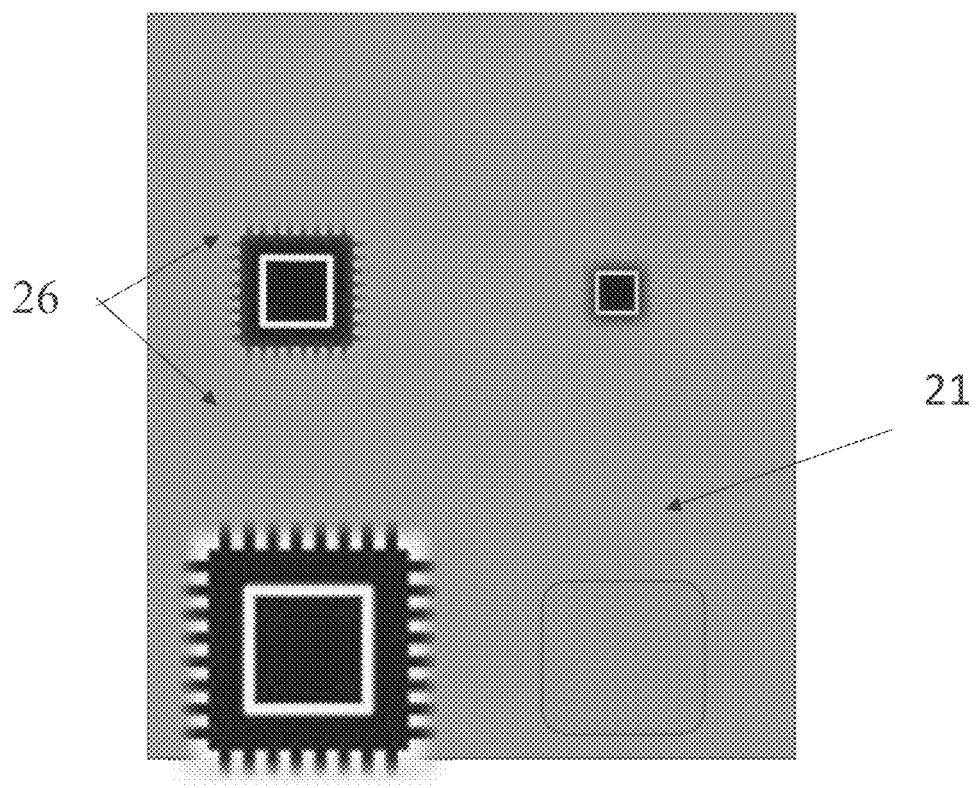

The hybrid radioisotope battery, using volumetric configuration and several connected semiconductor devices, could power solid state electronics. Example of these device are shown in FIGS. 10A and 10B. Depending on beta-emitting radioisotope and semiconductor material quantity and quality, battery 24 can power mobile devices, medical devices, unattended sensors 25, spacecraft instruments, MEMS, explosives monitoring, and microprocessors. The battery can be directly placed on the circuit as onboard power for sensor sleep mode or active mode. The battery is electronically and mechanically connected to the circuit board. The battery would resemble a basic dual in-line package or surface mount IC chip 26. The batteries have the potential to be maintenance free power sources for remote, long term, low power sensors. Because current sensors' microprocessors 26 have low quiescent power requirement for sleep mode ranging from 1 to 10 microwatt of electrical power, a small quantity of material (beta source and semiconductor) is able to continuously power sensor throughout its entire lifetime. The power source will have a lifetime of the sensor network or infrastructure rather than itself. This could introduce widespread intelligent sensor networks that could monitor enormous amounts area of diverse environments and have the constant power to rely valuable information back using communicate nodes.

Figure 11A:
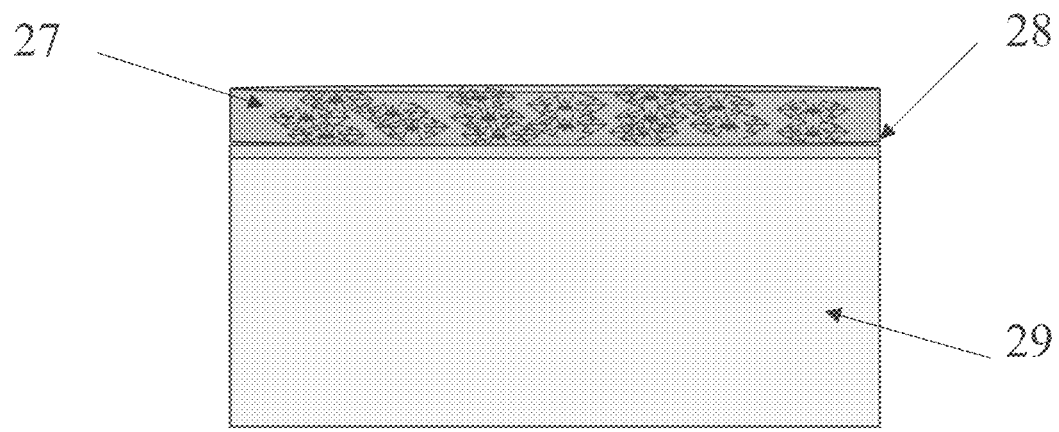
FIGS. 11A and 11B are illustrations of the composite layer deposited on conductive transparent substrates which are planar and curved, respectively.
Figure 11B:
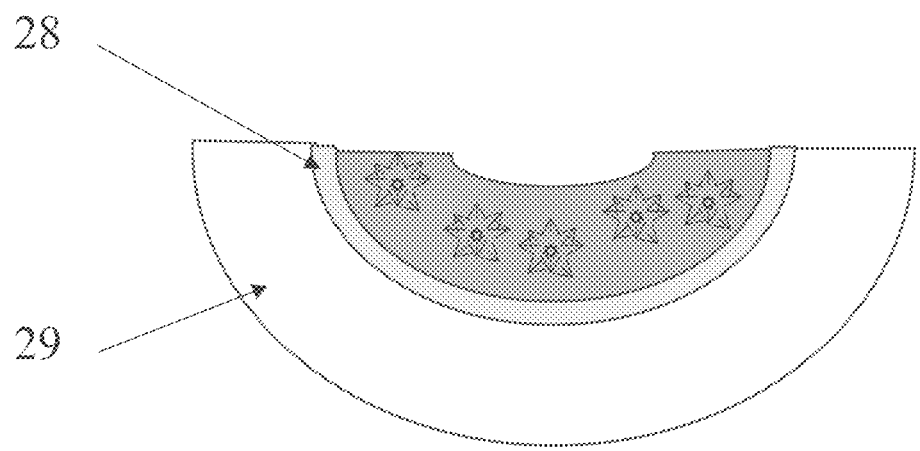

For luminescent applications, the composite layer 27 can be deposited on any conductive substrate that is transparent in the IR, UV and/or visible light spectrum as an application may need. This is shown in FIGS. 11A and 11B. Examples of these conductive substrates are graphene on quartz or glass and indium tin oxide (ITO) on quartz and glass. ITO and graphene layer 28 are several nanometers thick on glass or quartz 29, which is typically less than a millimeter thick. The substrate can be flat or curved.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims.

We claim:

1. An electrode for beta-photovoltaic cells comprising:
   a substrate formed of a conductive layer transparent to beta particles and photons;
   a composite layer of radioluminescent phosphor with beta-particle emitter radioisotope particles homogeneously dispersed therein formed on the conductive layer with a thickness to emit a combination of beta particles and photons; and
   a semiconductor comprising a P-i-N/P-u-N junction or a N-i-P-P junction which receives emitted beta particles and photons and generates electrical energy.

2. The electrode of claim 1, wherein the P-i-N/P-u-N semiconductor junction comprises:
   a GaN on sapphire substrate with a thickness range from 100 nm to 350 µm;
   a first layer of AlGaN or GaN N-template approximately 4 µm in thickness formed on the substrate;
   a second layer of N—AlGaN approximately 480 nm in thickness formed on the first layer;
   a third layer of u-AlGaN or i-AlGaN approximately 480 nm in thickness formed on the second layer; and
   a fourth layer of P—AlGaN approximately 50 nm in thickness formed on the third layer and which the composite layer is formed on.

3. The electrode of claim 1, wherein the N-i-P-P semiconductor junction comprising:
   a GaAs P-Substrate approximately 350 µm in thickness;
   a first layer of P—GaAs approximately 200 nm in thickness formed on the substrate;
   a second layer of a InGaP buffer layer approximately 50 nm in thickness formed on the first layer;
   a third layer of P—InGaP approximately 2000 nm in thickness formed on the second layer;
   a fourth layer of i-InGaP approximately 10 nm in thickness formed on the third layer; and
   a fifth layer of N—InGaP approximately 50 nm in thickness formed on the fourth layer and on which the composite layer is formed on.

4. The electrode of claim 2, wherein the P-i-N/P-u-N junction dopant concentrations are 4E17 atoms/cm$^3$ for the further layer of P—AlGaN, 1E16 atoms/cm$^3$ for the third layer of u-AlGaN, and 1E18 atoms/cm$^3$ for the second layer of N—AlGaN.

5. The electrode of claim 3, wherein the N-i-P-P junction dopant concentrations are 1E18 atoms/cm$^3$ for the fifth layer of N—InGaP, 1E16 atoms/cm$^3$ for the fourth layer of i-InGaP, and 5E16 atoms/cm$^3$ for the third layer of p-InGaP.

6. The electrode of claim 1, wherein the beta-emitter radioisotope comprises Ni-63, H-3, Pm-147, or Sr-90/Y-90.

7. The electrode of claim 1, wherein the radioisotope is part of an inorganic or organic compound.

8. The electrode of claim 1, where the radioluminescent phosphor particles are separate and distinct from the radioisotope particles in the homogeneous dispersion thereof in the composite layer.

9. The electrode of claim 1, wherein the radioluminescent phosphor particles range in size from about 100 nm to 20 microns in diameter.

10. The electrode of claim 1, wherein the radioisotope particles range in size from about from 10 nm to 1 micron in diameter.

11. The electrode of claim 1, wherein the concentrations of the radioluminescent phosphor particles and the radioisotope particles are about 75 and 25 wt/wt % based on solid contents, respectively.

12. The electrode of claim 1, wherein the packaging density range of the composite layer is between about 1.8 to 2.1 g/cm$^3$.

13. The electrode of claim 1, wherein the surface uniformity of the composite layer is about ±10 microns.

14. The electrode of claim 1, wherein the composite layer is substantially planar and provides an optical power output of approximately 50 nW/cm$^2$.

15. The electrode of claim 1, wherein the semiconductor comprising the P-i-N/P-u-N junction or the N-i-P-P junction is configured to absorb beta particles and/or photons and output electrical energy.

16. The electrode of claim 1, wherein the substrate comprises graphene, indium tin oxide (ITO) on quartz, glass, or sapphire.

17. The electrode of claim 16, wherein the graphene or ITO on the quartz, glass, or sapphire have thicknesses between 0.3 to 1 nm and 100 to 200 nm, respectively.

18. The electrode of claim 1, wherein the thickness of the substrate formed of the conductive layer ranges between about 10 nm to 1 micron.

19. The electrode of claim 1, wherein the thickness of the composite layer ranges between about 1 and 25 microns.

\* \* \* \* \*